(12) United States Patent
Huang et al.

(10) Patent No.: US 7,148,561 B2
(45) Date of Patent: Dec. 12, 2006

(54) BALL GRID ARRAY SUBSTRATE STRIP WITH WARPAGE-PREVENTIVE LINKAGE STRUCTURE

(75) Inventors: Chien Ping Huang, Hsinchu (TW); Tzong Da Ho, Taichung (TW); Isaac Yu, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 25 days.

(21) Appl. No.: 09/823,176

(22) Filed: Mar. 29, 2001

(65) Prior Publication Data

US 2002/0171129 A1    Nov. 21, 2002

(51) Int. Cl.
*H01L 23/495* (2006.01)
*H01L 23/04* (2006.01)
*H01L 23/48* (2006.01)

(52) U.S. Cl. .................. 257/670; 257/669; 257/676; 257/730; 257/780

(58) Field of Classification Search ........ 257/669–670, 257/780, 738, 676, 730
See application file for complete search history.

(56) References Cited

U.S. PATENT DOCUMENTS

| | | | |
|---|---|---|---|
| 5,635,671 A | 6/1997 | Freyman et al. | 174/52.2 |
| 5,652,185 A | 7/1997 | Lee | 437/219 |
| 5,691,242 A | 11/1997 | Nomi et al. | 437/206 |
| 5,847,446 A * | 12/1998 | Park et al. | 257/666 |
| 5,889,317 A * | 3/1999 | Huang et al. | 257/477 |
| 5,925,934 A * | 7/1999 | Lim | 174/52.4 |
| 6,268,652 B1 * | 7/2001 | Kimura | 257/666 |

\* cited by examiner

*Primary Examiner*—Douglas W. Owens
*Assistant Examiner*—Samuel Admassu Gebremariam
(74) *Attorney, Agent, or Firm*—Peter F. Corless; Steven M. Jensen; Edwards Angell Palmer & Dodge, LLP (57) ABSTRACT

A substrate strip with warpage-preventive linkage structure is proposed for a BGA (Ball Grid Array) application. The proposed substrate strip is composed of a series of substrates, each being used for the construction of an individual unit of a BGA package, and which is characterized by the provision of a warpage-preventive linkage structure, by which each substrate on the substrate strip is supported by means of no more than two tie bars, i.e., either by a two-point linkage structure or a one-point linkage structure, in contrast to the four-point linkage structure utilized by the prior art. During high-temperature fabrication steps when the substrate is subjected to thermal stresses, the substrate can freely expand toward the corners where no tie bars are provided; and consequently, it can be unwarped by the thermal stresses. This unwarped substrate allows the subsequently implanted ball grid array thereon to have high coplanarity.

16 Claims, 7 Drawing Sheets

BALL GRID ARRAY SUBSTRATE STRIP WITH WARPAGE-PREVENTIVE LINKAGE STRUCTURE

BACKGROUND OF THE INVENTION

1. Field of the Invention

This invention relates to BGA (Ball Grid Array) semiconductor packaging technology, and more particularly, to a substrate strip which is composed of a series of BGA substrates and which is characterized by the provision of a warpage-preventive linkage structure that can prevent each substrate on the substrate strip from thermally-stressed warpage during high-temperature fabrication steps.

2. Description of Related Art

BGA (Ball Grid Array) is an advanced type of semiconductor packaging technology which is characterized in the use of a substrate whose front side is used for the mounting of a semiconductor chip thereon, and whose back side is implanted with a grid array of solder balls. During a SMT (Surface Mount Technology) process, the BGA package can be mechanically bonded and electrically coupled to an external printed circuit board (PCB) by means of these solder balls.

Conventionally, BGA packages are fabricated in batch on a substrate strip composed of a series of substrates. One problem of the conventional substrate strip structure, however, is that each substrate thereon would easily suffer from thermally-stressed warpage during high-temperature fabrication steps, such as during die-bond cure, wire bonding, molding, and molding cure, during which the temperature is typically about 200° C. The warped substrate would then cause an uncoplanarity problem to the subsequently implanted solder balls on the back side thereof, which would adversely affect the quality of the subsequent mounting of the BGA packages on external printed circuit boards (PCB). This thermally-stressed warpage problem is illustratively depicted in the following with reference to FIGS. 1A–1D.

Figure 1A:
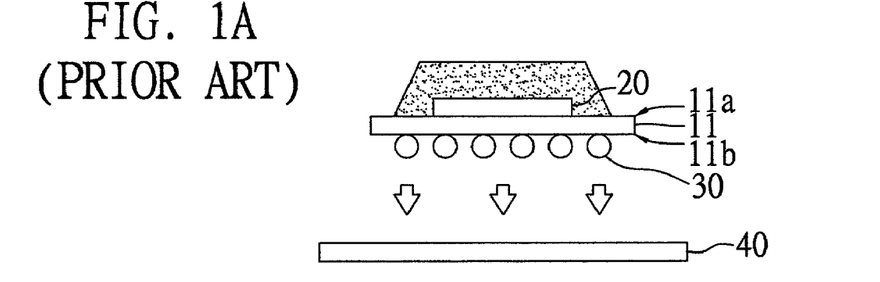
FIG. 1A (PRIOR ART) is a schematic diagram showing a sectional view of a typical BGA package.

FIG. 1A is a schematic diagram showing a sectional view of a typical BGA package. As shown, the BGA package is constructed on a substrate 11 whose front side 11a is mounted with a semiconductor chip 20 and whose back side 11b is implanted with a grid array of solder balls (i.e., ball grid array) 30. The semiconductor chip 20 can be electrically coupled to the substrate 11 by means of the well-known wire-bonding technology or flip-chip technology. During a subsequent SMT (Surface Mount Technology) process, the BGA package can be mechanically bonded and electrically coupled to an external printed circuit board (PCB) 40 by means of the ball grid array 30.

Figure 1B:
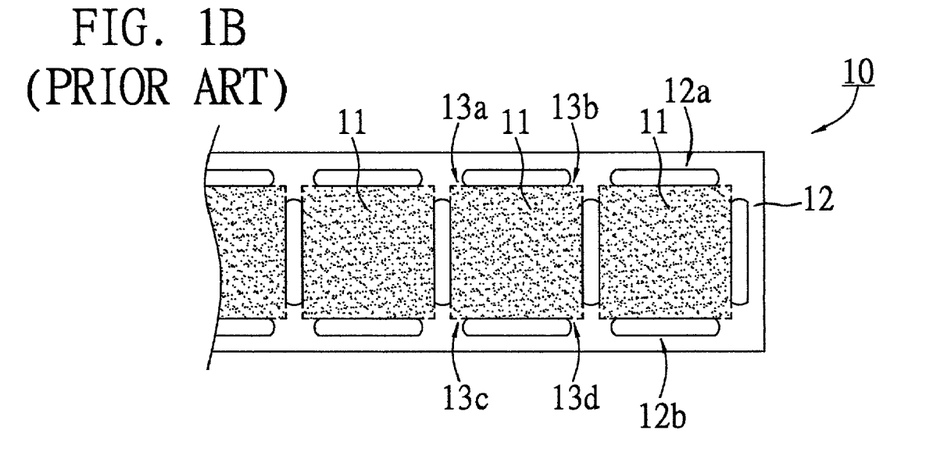
FIG. 1B (PRIOR ART) is a schematic diagram showing a top view of a conventional substrate strip with four-point linkage structure.

Referring further to FIG. 1B, in fact, BGA fabrication is typically implemented in batch on a substrate strip 10 which is composed of a series of substrates 11 supported on a frame 12 having a pair of parallel elongated supporting bars 12a, 12b. Each of the substrates 11 is used for the fabrication of an individual unit of a BGA package. Conventionally, each of the substrates 11 is rectangularly-shaped and linked to the supporting bars 12a, 12b by means of a four-point linkage structure consisting of four tie bars 13a, 13b, 13c, 13d on the four corners thereof. Typically, the upper-left tie bar 13a is also used to provide a gate (not shown) which is used for the injection of encapsulant during the fabrication of an encapsulation body (not shown) for encapsulating the semiconductor chip 20.

Figure 1C:
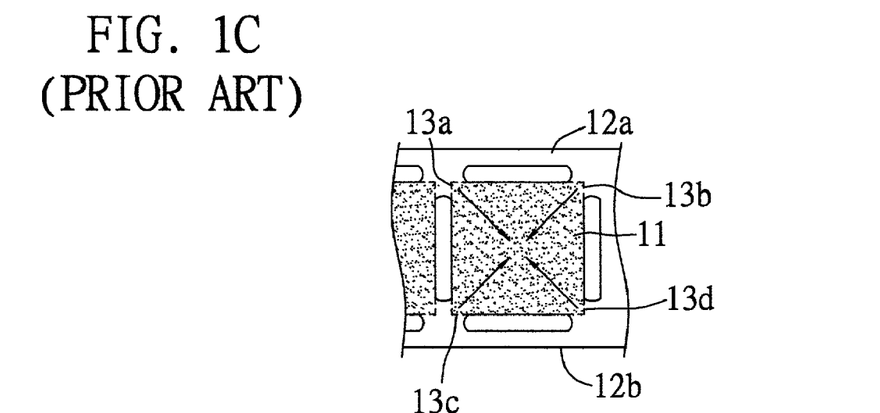
FIG. 1C (PRIOR ART) is a schematic diagram used to depict the thermal expansion of each substrate in the substrate strip shown in FIG. 1B under high-temperature conditions.

As shown in FIG. 1C, one drawback to the forgoing substrate strip 10 shown in FIG. 1B, however, is that during high-temperature fabrication steps, such as during die-bond cure, wire bonding, molding, and molding cure, each substrate 11 on the substrate strip 10 would be thermally expanded in all directions; but since the four corners of each substrate 11 are provided with the four tie bars 13a, 13b, 13c, 13d, the thermal expansion would be retarded in these directions; and consequently, the thermal stresses would concentrate toward the center of the substrate 11 (the directions of the thermal stresses are indicated by the arrows in FIG. 1C), thereby causing the center of the substrate 11 to be bulged out, resulting in a thermally-stressed warpage to each substrate 11.

Figure 1D:
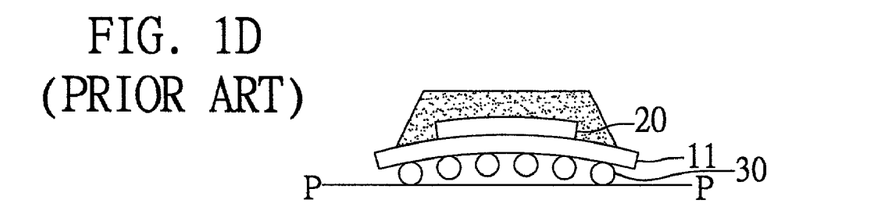
FIG. 1D (PRIOR ART) is a schematic diagram showing a BGA package constructed on a thermally-warped substrate.

As further shown in FIG. 1D, when the thermally-warped substrate 11 is implanted with the ball grid array 30, it would cause the implanted ball grid array 30 to have poor coplanarity. During the subsequent SMT process, this BGA uncoplanarity would cause some solder balls in the ball grid array 30 to be unreliably bonded to the PCB 40, thus resulting in a reliability problem in the BGA package.

The thermally-stressed warpage problem is particularly serious in large-size BGA substrates, including 35×35, 37.5×37.5, 40×40, and 42.5×42,5 (unit: millimeter) BGA substrates.

Related patents, include, for example, the U.S. Pat. No. 5,652,185 entitled "MAXIMIZED SUBSTRATE DESIGN FOR GRID ARRAY BASED ASSEMBLIES", the U.S. Pat. No. 5,635,671 entitled "MOLD RUNNER REMOVAL FROM A SUBSTRATE-BASED PACKAGED ELECTRONIC DEVICE"; the U.S. Pat. No. 5,691,242 entitled "METHOD FOR MAKING AN ELECTRONIC COMPONENT HAVING AN ORGANIC SUBSTRATE; to name just a few.

The U.S. Pat. No. 5,652,185 discloses an inventive method of packaging a BGA assembly with a substrate that has been formed from a substrate strip whose area has been maximized. The U.S. Pat. No. 5,635,671 discloses a package assembly constructed on a substrate with a novel degating region to allow removal of excess encapsulant formed on the substrate surface during molding without damaging the remainder of the device. The U.S. Pat. No. 5,691,242 discloses an advanced method for packaging an integrated circuit on an organic substrate. All of these patents, however, utilize a substrate strip with the above-mentioned four-point linkage structure, so that the above-mentioned warpage problem during high-temperature fabrication stops still exists.

SUMMARY OF THE INVENTION

It is therefore an objective of this invention to provide a substrate strip with a warpage-preventive linkage structure that can prevent each substrate on the substrate strip from thermally-stressed warpage during high-temperature fabrication steps so as to assure the quality of the BGA packages constructed on the substrates.

In accordance with the foregoing and other objectives, the invention proposes an improved substrate strip with a warpage-preventive linkage structure.

The substrate strip of the invention is characterized by the provision of a warpage-preventive linkage structure, by which each substrate on the substrate strip is supported by means of no more than two tie bars, i.e., either by a two-point linkage structure or a one point linkage structure, in contrast to the four-point linkage structure utilized by the prior art. During high-temperature fabrication steps when the substrate is subjected to thermal stresses, the substrate can freely expanded toward the corners where no tie bars are provided; and consequently, it can be unwarped by the thermal stresses. This unwarped substrate allows the subsequently implanted ball grid array thereon to have high coplanarity.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The substrate strip with warpage-preventive linkage structure according to the invention is disclosed in full details by way of several preferred embodiments in the following with reference to FIGS. 2A–2B, FIGS. 3A–3B, FIGS. 4A–4B, and FIGS. 5A–5B respectively.

Figure 2A:
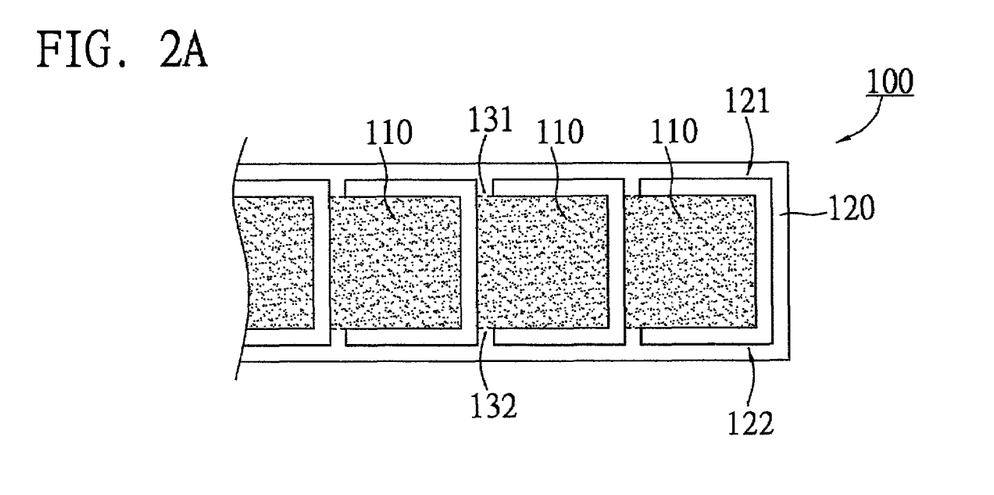
FIG. 2A is a schematic diagram showing a top view of a first preferred embodiment of the substrate strip according to the invention.
Figure 2B:
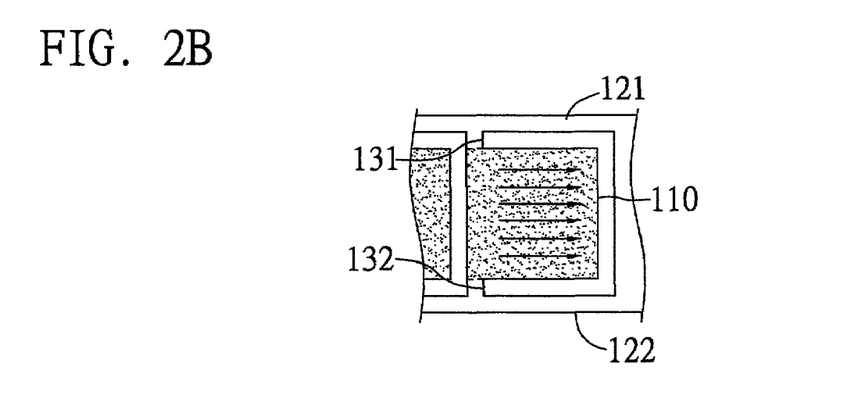
FIG. 2B is a schematic diagram used to depict the thermal expansion of each substrate in the substrate strip shown in FIG. 2A under high-temperature conditions.

First Preferred Embodiment (FIGS. 2A–2B)

The first preferred embodiment of the substrate strip with warpage-preventive linkage structure according to the invention is disclosed in full details in the following with reference to FIGS. 2A–2B.

Referring to FIG. 2A, the substrate strip 100 according to the first preferred embodiment of the invention includes plurality of rectangularly-shaped substrates 110 supported on a frame 120 having a pair of parallel elongated supporting bars 121, 122. By this embodiment, each substrate 110 is linked to the supporting bars 121, 122 by means of just two tie bars 131, 132 on the edges thereof, wherein the first tie bar 131 is provided on the upper-left corner of each substrate 110 and linked to the first supporting bar 121, while the second tie bar 132 is provided on the bottom-left corner of the same and linked to the second supporting bar 122.

FIG. 2B is a schematic diagram used to depict the thermal expansion of each substrate 110 during high-temperature fabrication steps. Under the high-temperature conditions, the substrate 110 would normally expand outwards in all directions. However, as illustrated in FIG. 2B, since the upper-left and bottom-left corners of the substrate 110 are provided with the tie bars 131, 132, the thermal expression would be retarded in these directions; and since no tie bars are provided on the upper-right and bottom-right corners, the substrate 110 can freely expand toward these corners, thus relieving the thermal stresses thereon. As a result, the substrate 110 is unlikely to become warped during the high temperature fabrication steps.

Since the substrate 110 would be unwarped in shape during the high-temperature fabrication steps, it allows the subsequently implanted ball grid array (not shown) thereon to have high coplanarity.

Figure 3A:
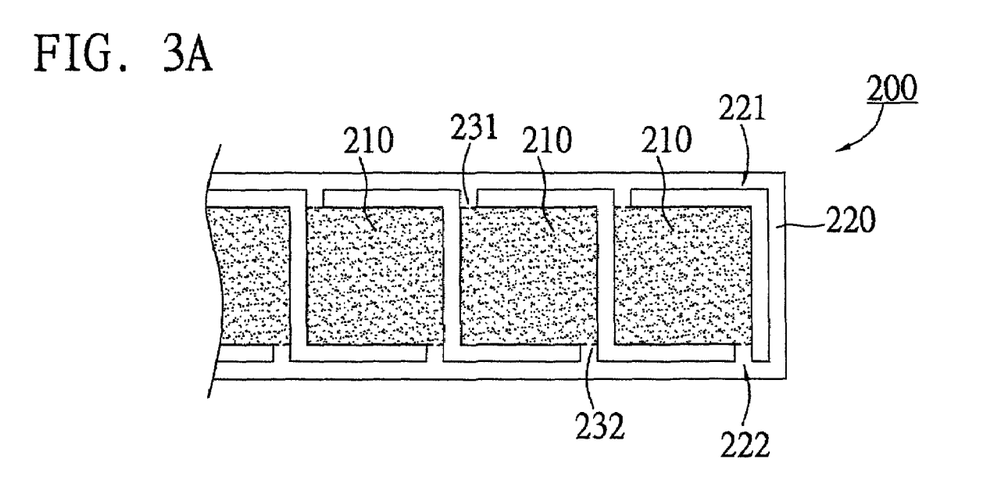
FIG. 3A is a schematic diagram showing a top view of a second preferred embodiment of the substrate strip according to the invention.
Figure 3B:
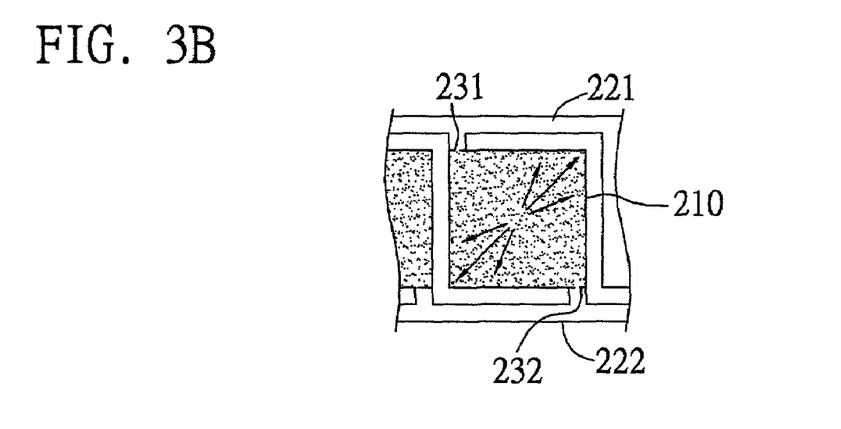
FIG. 3B is a schematic diagram used to depict the thermal expansion of each substrate in the substrate strip shown in FIG. 3A under high-temperature conditions.

Second Preferred Embodiment (FIGS. 3A–3B)

The second preferred embodiment of the substrate strip according to the invention is disclosed in full details in the following with reference to FIGS. 3A–3B.

Referring to FIG. 3A, the substrate strip 200 according to the second preferred embodiment of the invention includes a plurality of rectangularly-shaped substrates 210 supported on a frame 220 having a pair of parallel elongated supporting bars 221, 222. By this embodiment, each substrate 210 is linked to the supporting bars 221, 222 by means of a two-point linkage structure consisting of just two tie bars 231, 232, wherein the fist tie bar 231 is provided on the upper-left corner of the substrate 210 and linked to the first supporting bar 221, while the second tie bar 232 is provided on the diagonally-opposite corner (bottom-right corner) of the same and linked to the second supporting bar 222.

FIG. 3B is a schematic diagram used to depict the thermal expansion of each substrate 210 during high-temperature fabrication steps. Under the high-temperature conditions, since the upper-left and bottom-right corners of the substrate 210 are provided with the tie bars 231, 232, the thermal expansion would be retarded in these directions; and since no tie bars are provided on the upper-right and bottom-left corners, the substrate 210 can freely expand toward these corners, thus relieving the thermal stresses thereon. As a result, the substrate 210 would be unlikely warped during the high temperature fabrication steps, allowing the subsequently implanted ball grid array (not shown) thereon to have high coplanarity.

Figure 4A:
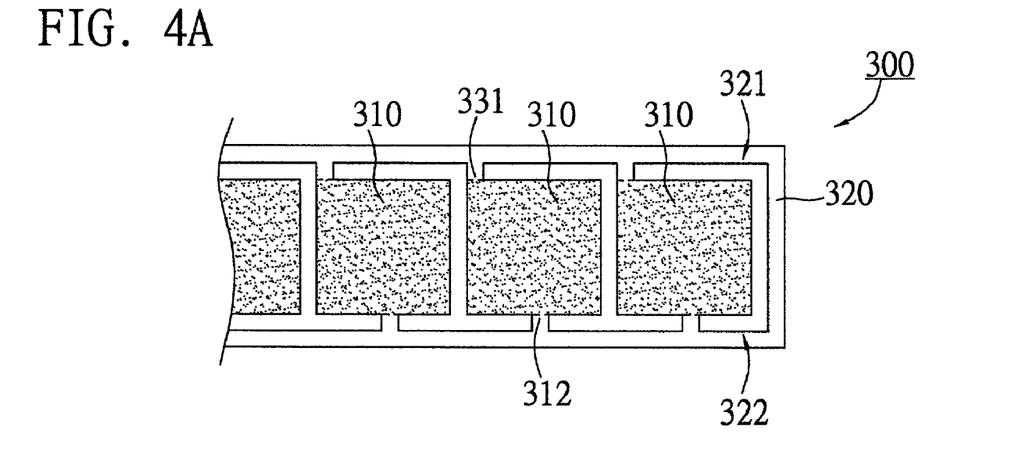
FIG. 4A is a schematic diagram showing a top view of a third preferred embodiment of the substrate strip according to the invention.
Figure 4B:
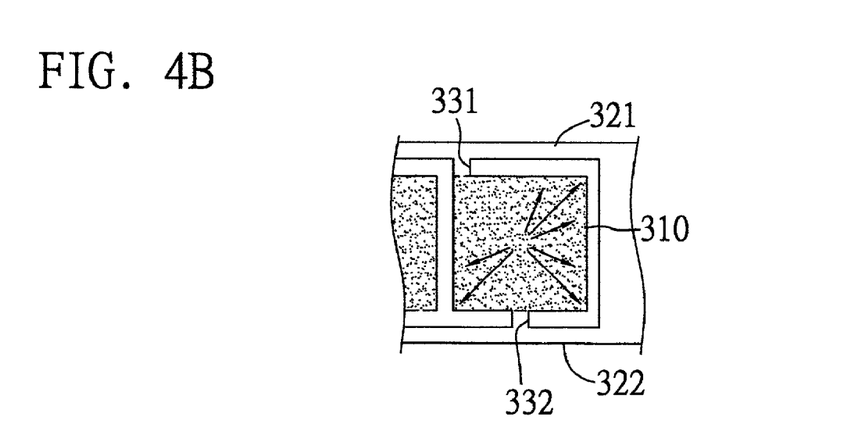
FIG. 4B is a schematic diagram used to depict the thermal expansion of each substrate in the substrate strip shown FIG. 4A under high-temperature conditions.

Third Preferred Embodiment (FIGS. 4A–4B)

The third preferred embodiment of the substrate strip according to the invention is disclosed in full details in the following with reference to FIGS. 4A–4B.

Referring to FIG. 4A, the substrate strip 300 according to the third preferred embodiment of the invention includes a plurality of rectangularly-shaped substrates 310 supported on a frame 320 having a pair of parallel elongated supporting bars 321, 322. By this embodiment, each substrate 310 is linked to the supporting bars 321, 322 by means of a two-point linkage structure consisting of just two tie bars 331, 332, wherein the first tie bar 331 is provided on the upper-left corner of the substrate 310 and linked to the first supporting bar 321, while the second tie bar 332 is provided on the bottom side of the same and linked to the second supporting bar 322.

FIG. 4B is a schematic diagram used to depict the thermal expansion of each substrate 310 during high-temperature fabrication steps. Under the high-temperature conditions, since the upper-left corner and bottom-side of the substrate 310 are provided with the tie bars 331, 332, the thermal expansion would be retarded in these directions; and since no tie bars are provided on the bottom-left corner ad the right side, the substrate 310 can freely expand toward these corners, thus relieving the thermal stresses thereon. As a result, the substrate 310 would be unlikely warped during the high temperature fabrication steps, allowing the subsequently implanted ball grid array (not shown) thereon to have high coplanarity.

Figure 5A:
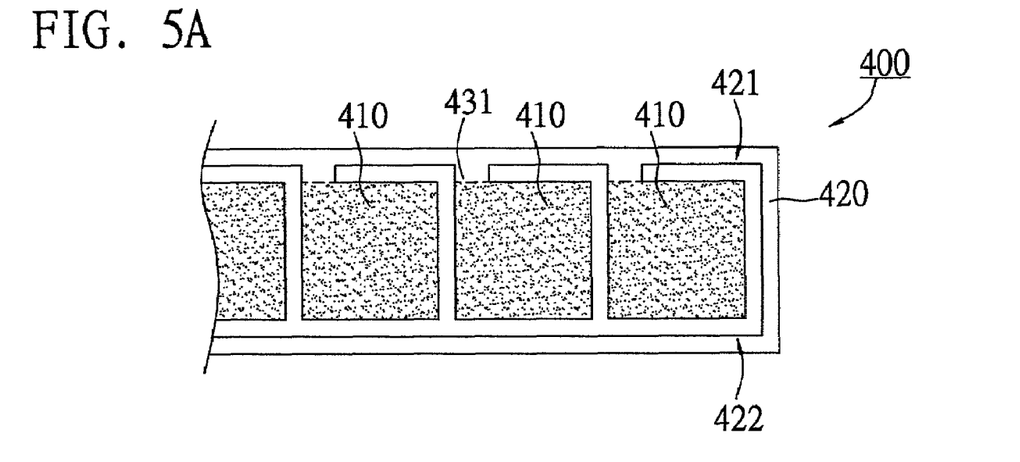
FIG. 5A is a schematic diagram showing a top view of a fourth preferred embodiment of the substrate strip according to the invention.
Figure 5B:
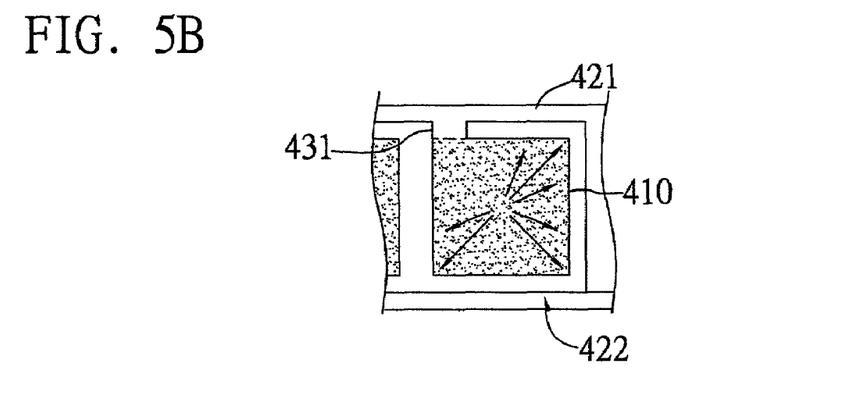
FIG. 5B is a schematic diagram used to depict the thermal expansion of each substrate in the substrate strip shown in FIG. 5A under high-temperature conditions.

Fourth Preferred Embodiment (FIGS. 5A–5B)

The fourth preferred embodiment of the substrate strip according to the invention is disclosed in full details in the following with reference to FIGS. 5A–5B.

Referring to FIG. 5A, the substrate strip 400 according to the forth preferred embodiment of the invention includes a plurality of rectangularly-shaped substrates 410 supported on a frame 420 having a pair of parallel elongated supporting bars 421, 422. By this embodiment, each substrate 410 is linked to the supporting bars 421, 422 by means of a one-point linkage structure consisting of just one tie bar 431 which is provided on the upper-left corner of each substrate 410 and linked to the first supporting bar 421.

The upper-left corner of the substrate 410 is also the area where a gate (not shown) used for the injection of encapsulant during the EMC (Epoxy Molded Compound) fabrication is provided (for this reason, the upper-left corner of the substrate 410 is referred to as "gating corner"). Since the gating structure is typically large in area, the one-point linkage structure can nevertheless provide a firm support to the substrate 410.

FIG. 5B is a schematic diagram used to depict the thermal expansion of each substrate 410 during high-temperature fabrication steps. Under the high-temperature conditions, since the three corners other than the upper-left one are provided with no tie bars, the substrate 410 can freely thermally expand toward these corners, thus relieving the thermal stresses thereon. As a result, the substrate 410 would be unlikely warped during the high temperature fabrication steps, allowing the subsequently implanted ball grid array (not shown) thereon to have high coplanarity.

Figure 6A:
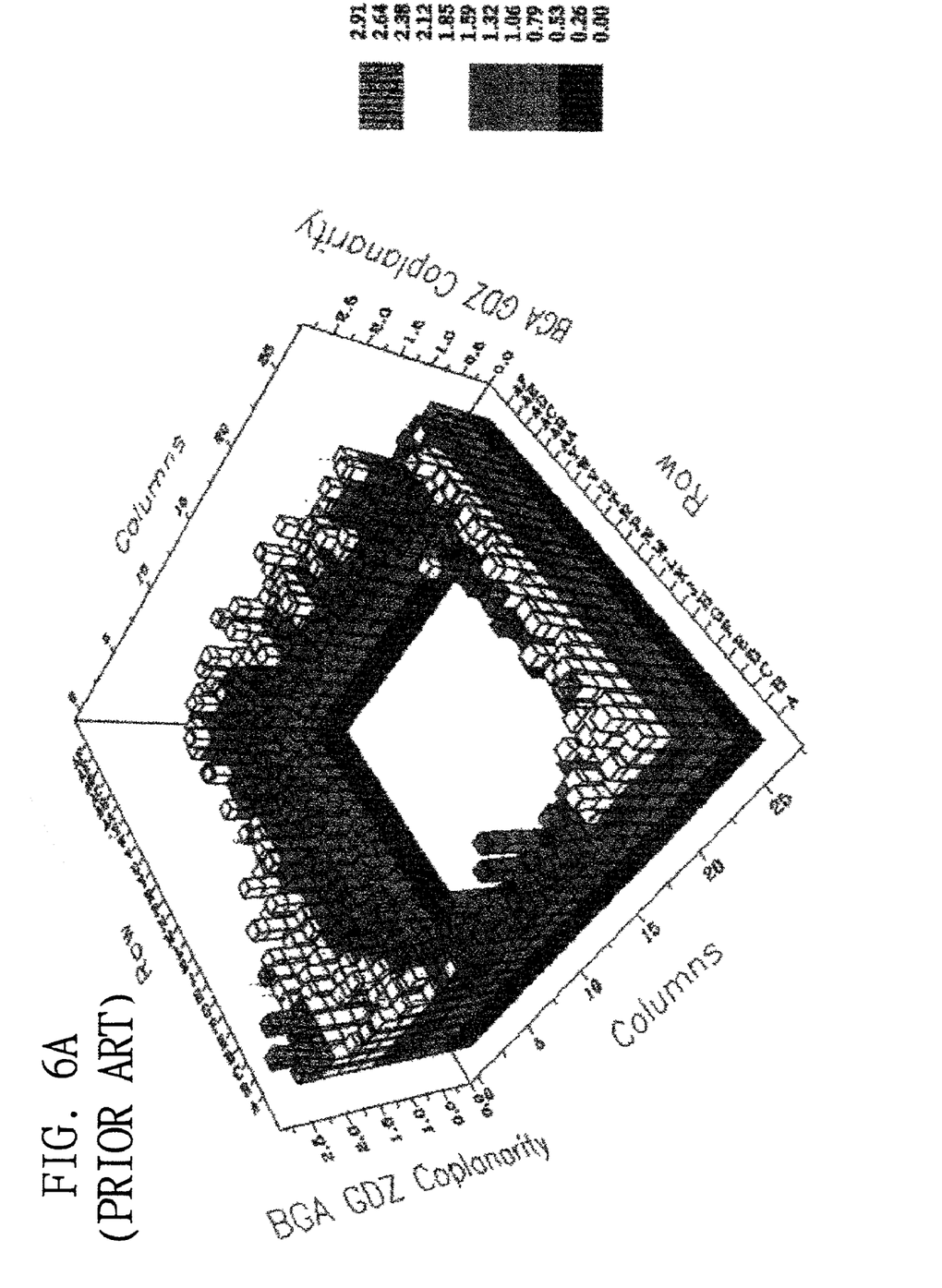
FIG. 6A (PRIOR ART) is a 3-dimensional graph used to illustrate the BGA coplanarity over a substrate obtained from the substrate strip of the prior art.
Figure 6B:
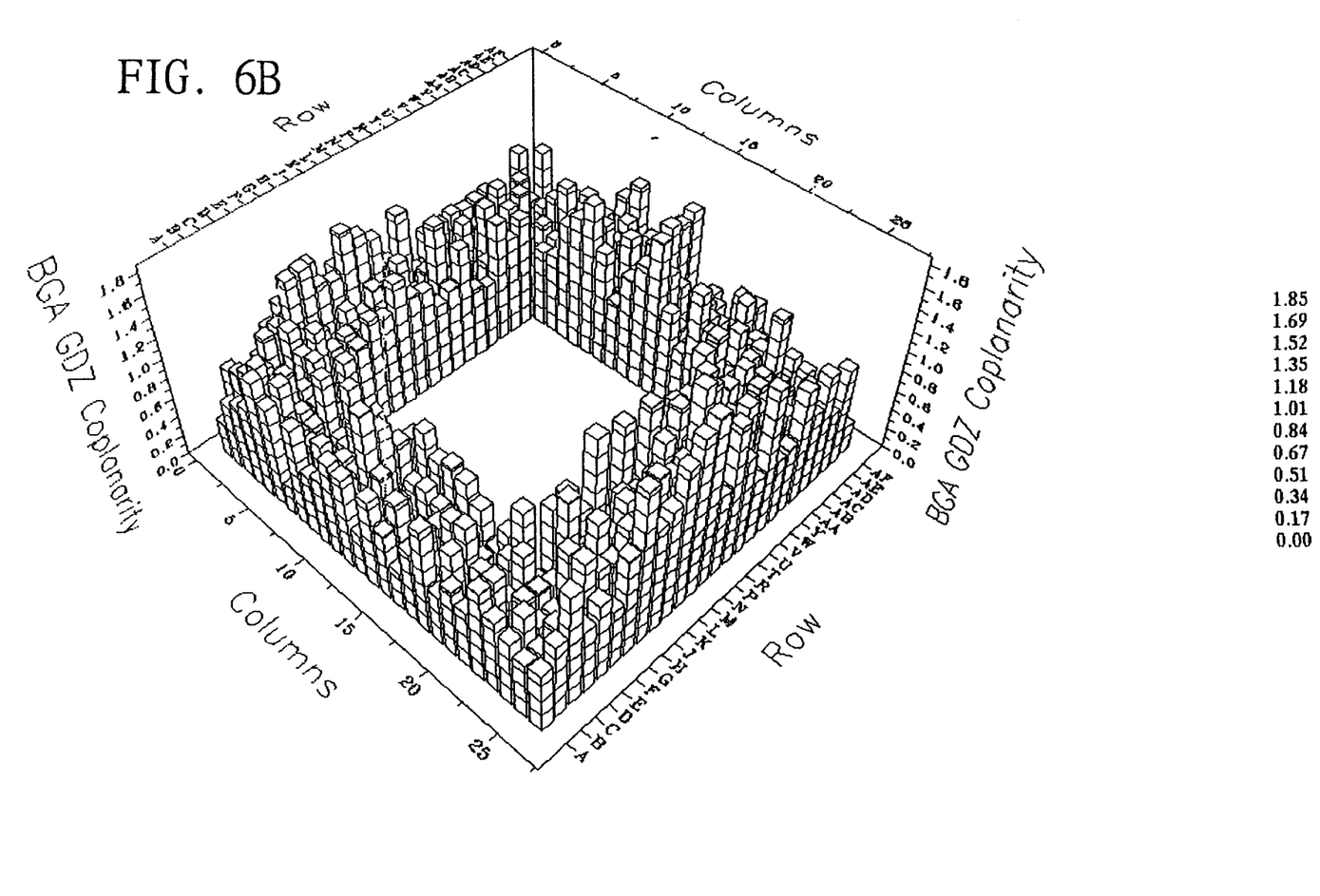
FIG. 6B is a 3-dimensional graph used to illustrate the BGA coplanarity over a substrate obtained from the substrate strip of the invention.

Test Results Data (FIGS. 6A–6B)

Through actual on-site tests, it is found that the invention can significantly help improve the coplanarity of the ball grid array implanted on the back side of the substrate by providing an unwarped substrate. One example of the test data is shown in the following table (the data represent the measured distance between the ball grid array and reference plane).

| | Min | Max | $\bar{x}$ | $\sigma$ | $C_{pk}$ |
|---|---|---|---|---|---|
| Prior Art | 2.05 | 4.91 | 3.17 | 0.82 | 1.05 |
| Sample 1 (the invention) | 1.67 | 3.77 | 2.26 | 0.59 | 1.95 |
| Sample 2 (the invention) | 1.56 | 2.48 | 1.95 | 0.25 | 5.11 |
| Sample 3 (the invention) | 1.98 | 3.33 | 2.61 | 0.44 | 2.38 |

It can be learned from the foregoing table that the invention can provide a significant improvement on BGA coplanarity over the prior art. Further, FIG. 6A shows one example of measured BGA coplanarity over a substrate obtained from the substrate strip of the prior art; while FIG. 6B shows one example of measured BGA coplanarity over a substrate obtained from the substrate strip according to the invention. It can be seen from these two graphs that the invention can provide a significant improvement on BGA coplanarity over the prior art. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A substrate strip, which comprises:
   (a) a frame having a pair of parallel supporting bars including a first supporting bar and a second supporting bar; and
   (b) at least one substrate supported on the supporting bars, the substrate being linked to the supporting bars by means of no more than two external tie bars, wherein at least one external tie bar is arranged on a corner of the substrate, and at least two corners of the substrate are free of being provided with the external tie bars and allow the substrate to expand toward the at least two corners to relieve thermal stresses.

2. The substrate strip of claim 1, wherein the substrate is dedicated for BGA application.

3. The substrate strip of claim 1, wherein the substrate is linked to the frame by means of just two tie bars.

4. The substrate strip of claim 3, wherein the two tie bars are arranged on two adjacent corners of the substrate.

5. The substrate strip of claim 3, wherein the two tie bars are arranged on diagonally opposite corners of the substrate.

6. The substrate strip of claim 3, wherein one of the two tie bars is arranged on one corner of the substrate and the other is arranged on one side of the substrate.

7. The substrate strip of claim 1, wherein the substrate is linked to the frame by means of just one tie bar.

8. The substrate strip of claim 7, wherein the just one tie bar is arranged on the substrate's gating corner.

9. A substrate strip, which comprises:
   (a) a frame having a pair of parallel supporting bars including a first supporting bar and a second supporting bar; and
   (b) at least one substrate supported on the supporting bars, the substrate being linked to the supporting bars by means of an external two-point linkage structure consisting of just two tie bars, wherein at least one tie bar is arranged on a corner of the substrate and linked to one of the supporting bars, and at least two corners of the substrate are free of being provided with the tie bars and allow the substrate to expand toward the at least two corners to relieve thermal stresses.

10. The substrate strip of claim 9, wherein the substrate is dedicated for BGA application.

11. The substrate strip of claim 9, wherein the two tie bars are arranged on two adjacent corners of the substrate.

12. The substrate strip of claim 9, wherein the two tie bars are arranged on diagonally opposite corners of the substrate.

13. The substrate strip of claim 9, wherein one of the two tie bars is arranged on one corner of the substrate and the other is arranged on one side of the substrate.

14. A substrate strip, which comprises:
  (a) a frame having a pair of parallel supporting bars including a first supporting bar and a second supporting bar; and
  (b) at least one substrate supported on the supporting bars, the substrate being linked to the supporting bars by means of an external one-point linkage structure consisting of just one tie bar arranged on a corner of the substrate and linked to one of the two supporting bars, and three corners of the substrate are free of being provided with the tie bar and allow the substrate to expand toward the three corners to relieve thermal stresses.

15. The substrate strip of claim 14, wherein the substrate is dedicated for BGA application.

16. The substrate strip of claim 14, wherein the just one tie bar is arranged on the substrate's gating corner.

* * * * *